United States Patent [19]
Greeson et al.

[11] 3,945,111
[45] Mar. 23, 1976

[54] METALLIZATION SYSTEM FOR SEMICONDUCTOR DEVICES, DEVICES UTILIZING SUCH METALLIZATION SYSTEM AND METHOD FOR MAKING DEVICES AND METALLIZATION SYSTEM

[75] Inventors: Richard L. Greeson, Scottsdale; Elliott M. Philofsky, Phoenix, both of Ariz.

[73] Assignee: Motorola, Inc., Chicago, Ill.

[22] Filed: Oct. 16, 1974

[21] Appl. No.: 515,279

Related U.S. Application Data

[62] Division of Ser. No. 430,431, Jan. 3, 1974.

[52] U.S. Cl. .................. 29/588; 29/590; 357/73
[51] Int. Cl.² ........................................ B01J 17/00
[58] Field of Search ......... 29/588, 589, 590; 357/73

[56] References Cited
UNITED STATES PATENTS

| | | | |
|---|---|---|---|
| 3,261,075 | 7/1966 | Carman | 29/588 |
| 3,271,124 | 9/1966 | Clark | 29/588 |
| 3,447,236 | 6/1969 | Hatcher | 29/588 |
| 3,621,563 | 11/1971 | Gee | 29/588 |
| 3,657,611 | 4/1972 | Yoneda | 29/589 |
| 3,844,029 | 10/1974 | Dibugnara | 29/588 |

*Primary Examiner*—W. Tupman
*Attorney, Agent, or Firm*—Harry M. Weiss; Henry T. Olsen

[57] ABSTRACT

A metallization system for metallurgically bonding a semiconductor die to metallic conducting slugs as terminals at the same time, and at the same temperature, that a surrounding glass sleeve is hermetically sealed to the conducting slugs for forming a zener diode, for example, is disclosed. The metallization system comprises a combination of aluminum, tin and palladium, for bonding to molybdenum, the aluminum being vapor deposited followed by a vapor co-deposition of aluminum and tin and further followed by a vapor deposited layer of palladium.

A method of making a device is disclosed wherein the die, two metal slugs of molybdenum and a preformed high temperature sealing glass are assembled together and subjected to a time-temperature cycle which includes a rapid rise to a high temperature at which metallurgical bonding of the die to the metal slugs and hermetic sealing of the glass to the metal slugs take place in a short time interval followed by rapid cooling of the assembly to a temperature slightly below the eutectic of aluminum and silicon.

5 Claims, 7 Drawing Figures

Fig./

METALLIZATION SYSTEM FOR SEMICONDUCTOR DEVICES, DEVICES UTILIZING SUCH METALLIZATION SYSTEM AND METHOD FOR MAKING DEVICES AND METALLIZATION SYSTEM

BACKGROUND OF THE INVENTION

This is a division of application Ser. No. 430,431, filed Jan. 3, 1974.

This invention is related to that disclosed in application Ser. No. 409,843, filed Oct. 26, 1973 in the names of Earl K. Davis and Kent W. Hansen and assigned to the same assignee as the subject invention.

This invention relates to semiconductive devices having increased power and mechanical strength and to methods of making them and it is an object of the invention to provide improved devices and methods of this nature.

More particularly the invention relates to a metallization system on a semiconductive chip, or die, and a method of forming it whereby the semiconductive chip may be metallurgically bonded to the associated terminals. In the case of devices such as zener diodes wherein a semiconductive chip, two terminal slugs and the glass sleeve are assembled together and subjected to a heating cycle for metallurgically bonding the chip to the slugs and for hermetically sealing the slugs to the glass sleeve, the metallurgical bond is formed at the same time as the glass seal. This is achieved without destroying any of the junctions or other properties of the semiconductive chip. The need for placing the chip and the slugs under stress is thus eliminated.

Throughout this patent application the terms semiconductive die, chip, device or the like are used interchangeably without intending any restriction unless specifically pointed out.

While the invention has specific application to diodes such as zener diodes, for example, it will be clear that the invention has application to any semiconductive device wherein a metallization system is utilized for bonding the device to the connecting terminals.

Metallization systems used with zener, and other diodes, have been of the chrome-silver-gold variety wherein subsequent bonding of the die to the lead terminals or slugs has been with lead-tin solders, for example. Such bonding was carried out at relatively low temperatures and of course required a surrounding glass sleeve which would seal to the terminals at about the same low temperatures. Such bonds while quite satisfactory had relatively low strengths and low power carrying capability. Accordingly it is a further object of the invention to provide an improved metallization system of the nature indicated providing greater strength and increased power carrying capability.

Efforts to increase the power carrying capability and mechanical strength, according to the invention, utilizes metallurgical bonding of the die to the terminals. The metallization system for this purpose is carried out at a substantially higher temperature. The latter requires the use of a surrounding glass sleeve which will seal to the terminals at the same relatively high temperature. Moreover, the time-temperature cycle of the metallization system and the glass sealing temperature had to be such as to not damage or destroy the junction or other properties of the semiconductive device. Particularly this is important for low voltage alloy devices. The high temperature time interval thus has to be short.

The aluminum-tin alloy system, according to the invention, has the desired properties including that of enabling rapid cooling of the devices from the glass sealing temperature without either sacrificing the metallurgical bond quality or overstressing the die.

Accordingly, it is a further object of the invention to provide improved devices and methods for achieving these desirable ends.

SUMMARY OF THE INVENTION

In carrying out the invention according to one form there is provided a metallization system for contacting and bonding to a semiconductor surface comprising: a first layer of aluminum deposited on the surface of said semiconductor, and a second layer comprising a mixture of aluminum and tin deposited on said layer of aluminum. More specifically a flash layer of palladium is deposited on said layer of aluminum and tin. More specifically still said first layer comprises aluminum of about 2000A to 3000A thickness, said second layer comprises 15,000A to 25,000A thickness of a mixture of aluminum and tin in which mixture the aluminum comprises a minimum thickness of about 2000A, and said layer of palladium comprises a thickness of about 800A to 1000A.

According to a further form of the invention there is provided a method of forming a metallization system on a semiconductor surface for subsequent bonding to an electrode comprising the steps of: preheating such semiconductor surface to about 200°C, forming an aluminum-silicon alloy on such surface and a layer of aluminum thereover, removing said preheat, and forming a mixture of aluminum and tin on said layer of aluminum, followed by a flash layer of palladium.

According to a still further form of the invention there is provided a semiconductor device having a metallurgical bond between the semiconductor die and the terminals attached thereto comprising a semiconductor die, a metallization system on each side of said die comprising an aluminum layer and a mixture layer of aluminum and tin, terminals comprising one of the group of metals of molybdenum, copper, nickel, silver, platinum, palladium, rhodium, tungsten and Dumet (a copper clad steel) on each side of said die and metallurgically bonded to said metallization system, and a glass preform bonded to each of said metal slugs.

According to a still further form of the invention there is provided a method of making a semiconductor device including a semiconductor chip, at least one terminal metallurgically bonded to said chip and a glass sleeve bonded to said terminal comprising the steps of: forming a semiconductor chip having a metallization system thereon comprising a layer of aluminum, a mixture layer of aluminum and tin on said aluminum layer, providing at least one terminal consisting of one metal selected from the group of molybdenum, copper, nickel, silver, platinum, palladium, rhodium, tungsten, Kovar (an alloy of nickel in cobalt and iron) and Dumet, disposing said terminal adjacent said semiconductor chip; providing a glass sleeve surrounding said terminal; subjecting the assembly of said chip, said terminal and said glass sleeve to a time-temperature cycle comprising an increase in temperature to about 725°–825°C in about 6–10 minutes followed by a decrease in temperature to slightly below the aluminum-silicon eutectic in a period of about 10–30 seconds and followed by a cool down to room temperature in about 5–7 minutes.

BRIEF DESCRIPTION OF THE DRAWINGS

For a more complete understanding of the invention reference should be had to the accompanying drawings in which, FIG. 1 is a sectional view, somewhat diagrammatic, and on an enlarged scale, of a diode embodying the invention.

DESCRIPTION OF THE PREFERRED EMBODIMENT

Figure 3:
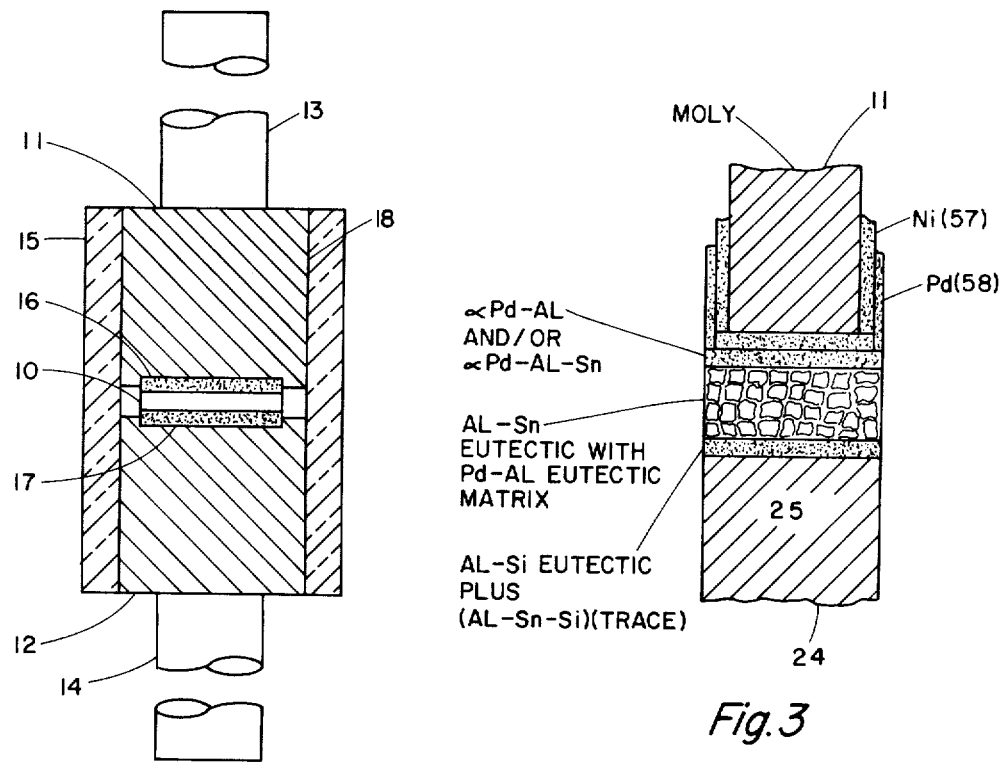
FIG. 3 is a sectional view on a larger scale of a portion of the structure shown in FIGS. 1 and 2.

Referring to the drawings there is shown in FIG. 1 a diode which, for example, may be a zener diode comprising a semiconductive die, or chip 10, a pair of metallic terminals or slugs 11 and 12 bonded at respective surfaces to the die 10, conductors 13 and 14 attached to and axially extending from respectively, terminals 11 and 12 and a glass sleeve 15 bonded to the terminals 11 and 12. The bonds at the surfaces 16 and 17 of the die 10 and the metallic slugs 11 and 12, respectively, are metallurgical bonds in accordance with the invention, and the bonds formed between the interior surface 18 of the glass sleeve 16 and the adjacent surfaces of the metallic slugs 11 and 12 are high temperature hermetic seals formed at the same time that the metallurgical bonds are being formed.

Figure 2:
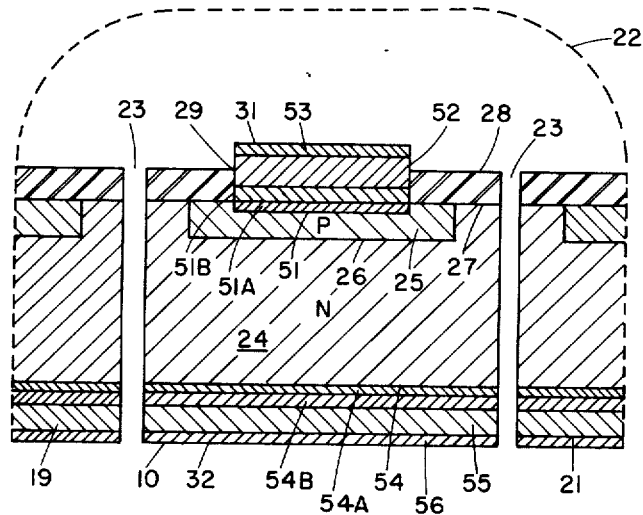
FIG. 2 is a sectional view on a larger scale of a portion of the structure shown in FIG. 1 and illustrating its method of construction.

Referring to FIG. 2 there is diagrammatically shown an enlarged version of the chip, or die, 10 and, in part, its manner of formation. Thus the die 10 is shown between partially broken rectangles 19 and 21 which represent additional and identical dice on each side of die 10. These are representative of a wafer represented by the broken line 22 which would include as many die 10 as may be formed within the wafer according to well understood principles. A large number of dice 10 are formed in wafer 22 and after all of the processing is carried out, as will be described, individual dies 10, 19, 21, etc. are formed by laser scribing at the kerfs 23 and breaking into dice as is well understood. The processing will be described with respect to the die 10 of FIG. 2, but it will be understood that the same processing will have been carried out over the whole surface of the wafer 22.

As to the die 10 a body, or substrate 24, of silicon having N type doping, for example, of suitable resistivity is selected and a P type region 25 is diffused therein to form a junction 26. If desired in a particular case, the substrate 24 may be of P type doping and the diffusion 25 may be of N type doping. The diffusion 25 is performed in any well known manner such as by photoresist masking or the like followed by diffusion. Corresponding islands or P type regions 25 are of course formed in all of the areas which will become the dice 19, 21, etc. After the diffusions have been made the upper surface 27 of the wafer, the wafer is covered with a layer 28 of silicon dioxide of suitable thickness. The silicon dioxide layer may be formed in any well known manner. After the layer of silicon dioxide 28 is formed, suitable windows 29 are etched therein, one for each die in any suitable well known manner such as by the photoresist and etching techniques. Into each one of the windows 29 a metal system 31 is formed in good ohmic contact with the P doped region 25 and a second metallization system 32 identical to 31 is formed on the other side of the substrate 24.

Figure 4:
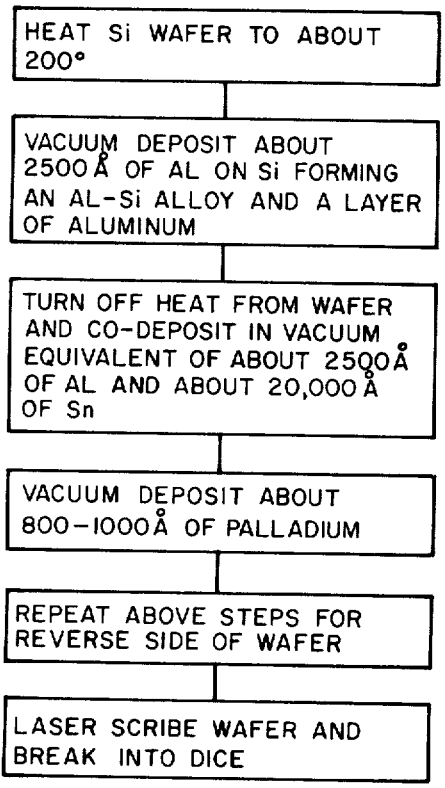
FIG. 4 is a block diagram illustrating steps in the formation of the semiconductive device and its metallization system.

The metallization system 31, 32, in accordance with the invention, and its method of formation, will be described in connection with FIGS. 2, 4 and 5.

The metallization system comprises a combination of a layer of aluminum alloyed to the silicon and a combined layer of aluminum and tin formed over the first aluminum layer. A layer of palladium may be formed over the combined aluminum and tin layer in order to prevent oxidation of the aluminum during storage of the dice before being utilized in the formation of devices.

Figure 5:
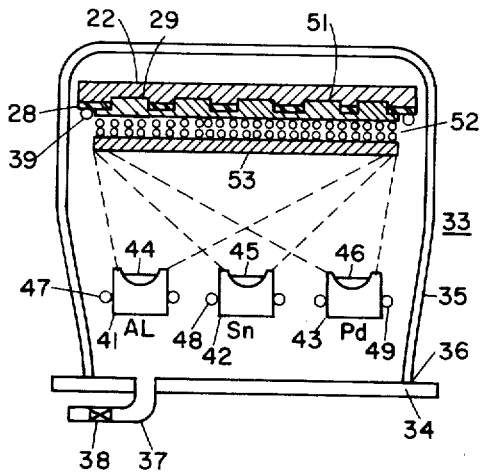
FIG. 5 is a diagrammatic view partially in section illustrating the method of forming the metallization system.

Referring to FIG. 5 there is shown a vacuum chamber 33 comprising a base 34 and an inverted bell jar, or the like, 35. The jar 35 may be sealed to the base 34 at the joint 36 in any suitable manner and any degree of vacuum may be drawn through conduit 37 and valve 38. Interiorally of the chamber 33 there is a wafer 22 disposed on a suitable support 39 which may, for convenience, also be a heating arrangement of any well known variety for heating the wafter 22 up to a desired temperature, for example, of about 200°C.

The wafer 22 in FIG. 5 has been processed as described and includes the layer of silicon dioxide 28 and the windows 29. Also disposed inside chamber 33 are three containers 41, 42 and 43 containing respectively appropriate amounts of aluminum 44, tin 45 and palladium 46. Any well known type of heaters, electrical resistance, induction or the like 47, 48 and 49 are provided for heating the containers 41, 42 and 43 respectively.

After the wafer 22 has been heated to about 200°C, the aluminum 44 is heated to its boiling, or vaporization, temperature and a layer 51 of aluminum is deposited. The aluminum is heated to its boiling point of 2467°C and an equivalent thickness of about 2500A is deposited as shown in FIG. 4. The deposited aluminum forms a thin layer of aluminum-silicon eutectic alloy shown as 51A in FIG. 2 and a layer of pure aluminum shown as 51B in this Figure.

Throughout this specification, the symbol A means an Angstrom, a unit of length equal to one ten billionth of a meter.

After the layer 51 of aluminum (51A and 51B) is deposited the heat is turned off from wafer 22 and it is permitted to cool down at whatever rate the apparatus provides. During the cooling process and immediately following the initial aluminum deposition step the tin 45 is heated by the heater 48 to its boiling, or vaporization, temperature of 2270°C. The aluminum remains at its boiling temperature. During this step the aluminum 44 and the tin co-deposit on the wafer to form the layer shown as 52 in FIGS. 2 and 5. The equivalent thickness of aluminum deposited during this step is about 2500A and about 20,000A of tin are deposited. As a practical matter the amount of aluminum 44 and the amount of tin 45 are selected ahead of time so that the vapor deposition of these two metals continues until the containers 41 and 42 are empty.

Following the co-deposition of aluminum and tin the palladium 46 is heated, by heater 49, to its boiling, or vaporization, temperature of 2927°C to deposit a flash layer 53 of palladium about 800A to 1000A thick.

After the three layers of aluminum 51, aluminum-tin 52 and palladium 53 are deposited the wafer is turned over and disposed on the support 39. The vacuum is again formed inside of chamber 33 and the same cycle of deposition of aluminum, tin and palladium as already described is applied to give the layers, as shown, forming the metallization system 32 of FIG. 2. Thus, there is a layer of aluminum 54 of about 2500A thick deposited to form an aluminum-silicon eutectic alloy layer 54A and a layer of aluminum 54B on top of which there is co-deposited a matrix of aluminum and tin 55 comprising an equivalent of an additional 2500A of aluminum and about 20,000A of tin to give the co-deposit layer 55. On top of the aluminum-tin co-deposit layer 55 there is deposited a layer of palladium 56 of about 800A to 1000A thickness.

After the second metal system 32 has been completed, the wafer is removed from the chamber 33 and is permitted to cool following which the wafer 22 is laser scribed at the kerfs 23 and broken into chips or dice to be subsequently formed into the diodes, for example, as will be described.

while according to a preferred form of carrying out the invention aluminum and tin are separately evaporated to form the co-deposit layer 52, it will be understood that the layer 52 may be deposited from a tin-aluminum alloy for example one in the proportions of 90 tin-10 aluminum. The ratio of tin to aluminum may be varied for particular circumstances and since these two metals boil at temperatures relatively close to each other, equal volumes of the metals may be deposited in about the same time interval. The co-deposition layer should have a minimum thickness of 2000A in order to avoid subsequent peeling of the layer. The initial layer of aluminum 51 should not be less than about 2000A of equivalent thickness, and may have a thickness of between 2000A and 3000A, the co-deposition layer 52 of tin and aluminum may have a thickness of about 15,000A to 25,000A and the layer of palladium 31 may have a thickness of between 500A and 1000A.

After the dice have been formed as described a particular die 10, referring to FIG. 1, may be assembled in any suitable fixture as will be well understood along with two metallic slugs 11 and 12 and a surrounding glass sleeve 15. This assembly may be passed through a furnace or sealer and subjected to the time-temperature cycle illustrated, for example, in FIG. 7 and the metallurgical bond between the metal slugs and the die formed as well as the hermetic seal to the glass sleeve.

The metallic slugs 11 and 12 may be formed of any metal which will be wet by tin, which has the required properties of electrical conductivity and thermal expansion to be compatible with the glass of sleeve 15. Thus the slugs 11 and 12 may be formed of molybdenum, copper, nickel, silver, platinum, palladium, rhodium, tungsten, Dumet, Kover and perhaps others. The metal of the slugs in addition should not form brittle intermetallic compounds with aluminum.

Forming a metallurgical bond between the die and the metallic slugs requires that the bonding temperature be above the complete melting point of the bonding metal, that is, not just about the eutectic temperature but the melting point of the highest melting point of the material there. Thus the aluminum in the subject invention must be completely melted and the temperature must be at least 660°C, the melting point of aluminum. Preferably the bonding temperature should be at least 25°C above this melting point for example in the vicinity of 685° to 700°C. In the actual case the percentages of aluminum and tin are not at the eutectic percentages so that the melting point is still higher than the eutectic and in the actual case temperatures in the vicinity of 725° to 825°C are feasible.

The foregoing also requires that the glass of the glass sleeve 15 soften sufficiently to seal to the slugs 11 and 12 without melting to the extent of completely deforming. One composition of glass which has been found satisfactory but is not part of the subject invention is disclosed and claimed in the aforesaid co-pending application of Earl K. Davis and Kent W. Hansen. The composition of said glass in range and weight percent comprises the following and has been found to seal to molybdenum slugs without the presence of oxide thereon, in an atmosphere of nitrogen, at a temperature in the vicinity of 740° to 760°C in a period of time less than 1 minutes:

|  | Preferred | Range |
|---|---|---|
| $SiO_2$ | 22 | 20–25 |
| PbO | 40 | 35–45 |
| ZnO | 10 | 8–12 |
| $Al_2O_3$ | 9 | 6–12 |
| CdO | 1 | 0–3 |
| $B_2O_3$ | 18 | 15–21 |
|  | 100 |  |

When the metal slugs 11 and 12 are formed of molybdenum they are provided with a flash coating of nickel 57 (FIG. 3) of about 50 to 140 micro inches in thickness and a flash coating of palladium 58 of about 10 to 20 micro inches in thickness. In FIG. 3 the various layers are shown and will be described as though the metallurgical bonding and glass sealing cycle have been gone through. Whenever it is necessary to plate another metal to molybdenum, such, for example, as the aluminum-tin alloy, the coating of nickel 57 is desirable. A flash coating of palladium or some other noble metal is plated over the nickel to minimize oxidation of the nickel. In the event that the metallic terminal slugs 11 and 12 are of other metal such for example as Dumet alloy the flesh coatings of nickel and palladium may not be necessary.

Figure 6:
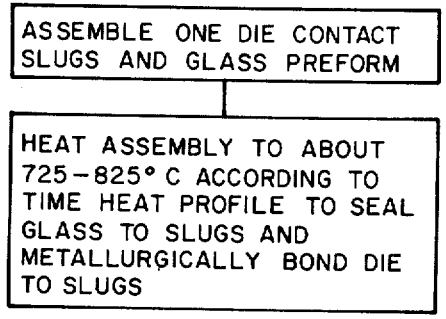
FIG. 6 is a block diagram illustrating steps in the formation of the final device.

Referring to FIG. 6 there is shown a block diagram which represents the formation of the final diode device. This is shown, broadly, as a two step method or process the first of which is assembling the die, contact slugs and glass preform, or sleeve, as may be visualized in FIG. 1. The second step is subjecting the assembly to a time-temperature profile shown in FIG. 7 wherein the assembly is heated to about 725°–825 C and subsequently cooled for performing the metallurgical bond of the die to the slugs and a seal of the glass preform to the slugs.

Figure 7:
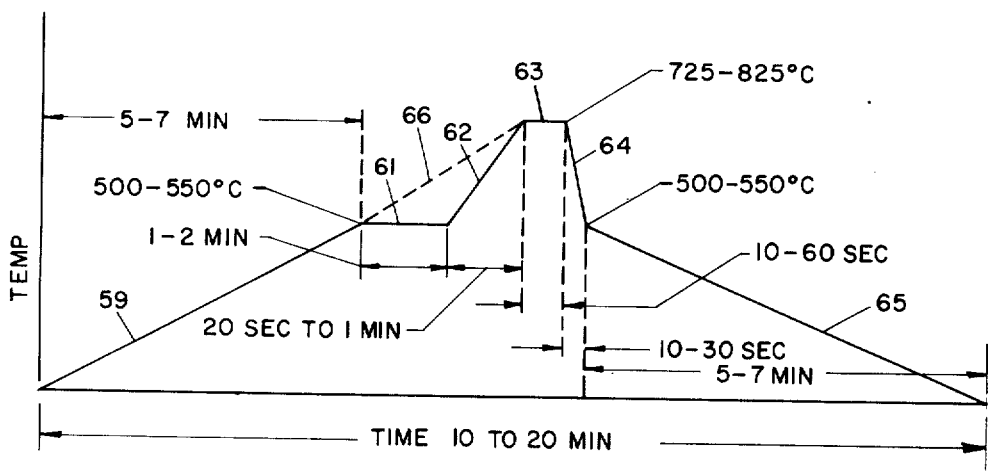
FIG. 7 is a graph illustrating a time-temperature cycle according to the invention.

Referring to FIG. 7 the time-temperature cycle according to one form of the invention comprises a rising temperature portion 59 terminating at a plateau region 61, an up spike region 62 terminating at a further hold or plateau 63, a downward spike region 64 and a cooling down region 65.

The heating of the assembled units may be carried out in a well known belt type furnace in which a temperature profile as shown in FIG. 7 is maintained. The region 59 of heating from ambient to about 500°–550°C which is below the aluminum-silicon eutectic temperature of 577°C in about 5–7 minutes is not critical as to time. The time period can be greater or lesser than 5–7 minutes as may be appropriate. The temperature however should remain below the eutectic temperature in order to prevent the diffusion of silicon from out of the junction particularly in alloy junction devices. The dwell time period 61, or plateau, shown as being from 1 to 2 minutes also is not critical and may be longer or shorter. The plateau, or soak period, 61 is advantageous in a belt type furnace in order that all parts including the devices and the boat containing them be up to temperature in order that the next period 62 may be carried out effectively. It is desirable that the change from the temperature at the plateau 61 and the temperaure at the plateau or dwell 63 of 725°–825°C be fairly rapid. In effect, it should be a spike rise in temperature, shown for example as 20 seconds to one minute, in order to avoid the diffusing out of silicon in the case of low voltage silicon alloy junction devices. When all of the parts start at the plateau temperature of 500°–550°C it is feasible, in a belt type furnace, to have the temperature follow along the line 62. The plateau 63 temperature of 725°–825 C is selected to be above the aluminum-silicon eutectic temperature and to be above the melting point of all of the aluminum present in the layers 51 (51A, 51B) and 52 in order that a metallurgical bond may take place between the silicon of the die and the metal of the terminal slugs 11 and 12 for example molybdenum.

The time period of the dwell 63 is shown as 10–60 seconds and should be a short as necessary in order to avoid out diffusion of silicon from low voltage alloy devices.

The temperature at the plateau 63 and the dwell time thereat is such that the glass of the glass sleeve 15 softens sufficiently to flow into contact with the adjacent surfaces 18 of the metal slugs 11 and 12 to form a sealing bond therewith. The temperature is sufficient however so that the glass preform 15 does not lose its shape.

The downward temperature region 64 is in the nature of a spike down from 725°–825°C to 500°–550°C which is below the aluminum-silicon eutectic. The time for the drop represented by line 64 is shown as 10–30 seconds and is relatively critical in that the time above the aluminum-silicon eutectic should be short to avoid out diffusion of aluminum from the junction in alloy junction devices. The relatively rapid cooling at this stage also serves to lock in some residual stresses which is of advantage in sharp knee type zener diodes. The rapid cool down of region 64, however, does not overstress the die because the liquidus-solidus temperature range of aluminum-tin is fairly broad. The mixture of aluminum and tin remains slushy until about 230°C.

The total time of the spike between the rise 62, the dwell 63 and the drop 64 is relatively critical in that this total time should not be greater than that within which the out diffusion of silicon from the junction in alloy junction devices becomes significant. The time range as shown for this region has been found to be such as to produce completely satisfactory devices.

In other forms of sealers or furances, for example, the form known as a DAP sealer, the increase in temperature instead of following the regions 61 and 62 may follow a line shown as the dotted line 66 where the temperature goes directly from the 500°–550°C to the glass sealing temperature at region 63. In this device similarly good metallurgical bonds and good glass seals are formed.

The cooling down region 65 from 500°–550°C to ambient is shown as being in the region of 5–7 minutes and is not critical. This can be longer or shorter as a particular furnace is programmed to operate.

The total time for the temperature cycling is shown in FIG. 7 as being in the range of 10–20 minutes. This is a very short time compared to other ways of forming such devices and results in a very strong metallurgical bond and glass seal as compared with known devices. Substantially increased power may be obtained without damage to the device and substantially increased strength is obtained.

The temperature at the dwell 63 also is as high as shown in order to produce a glass seal in a relatively short time. A lower temperature might be utilized in some instances but this would require a longer time for the sealing of the glass to take place and this time factor would not necessarily be good in the instance of alloy junction type devices.

Refering to FIG. 3 there is shown a representation of what is believed might be the case as to the nature of the metallic structure when the metallurgical bond is complete. Thus there is believed to exist at the P region 25 an Al-Si eutectic alloy layer plus possibly a trace of a ternary alloy of Al-Sn-Si. Next to the Al-Sn eutectic there is believed to be a layer of Al-Sn eutectic with a Pd-Al eutectic matrix. The palladium (Pd) which comes from the flash layer 53 of palladium used for protecting the aluminum from oxidation, is believed to take up any excess aluminum which might exist from the original aluminum deposition. Next to the Al-Sn eutectic is believed to be a layer of alpha Pd-Al alloy and/or alpha Pd-Al-Sn alloy. The very thin layer of palladium 53 on the diode chip as well as the palladium layer 58 on the metallic slug 11 are sufficiently thin as they do not significantly enter into the formation of the metallurgical bond.

The metallurgical bond formed between the chip and the terminal slugs by the aluminum, tin and palladium metals, as described, and as believed to exist as represented in FIG. 3 has been found to be very strong. For example, when the slugs 11 and 12 are moved back and forth such as by moving the lead conductors 13 and 14 back and forth until breakage occurs, it has been found that the rupture or break occurs within the silicon chip rather than in the metallic system of aluminum, tin and palladium.

The aluminum-tin system according to the invention with the incidental addition of palladium has substantial advantages of strength and additional power capability as compared with the well known metallization system of chrome-silver-gold.

The metallization system according to the invention is advantageous in several ways. Aluminum is a good electrical conductor and alloys well with silicon. It is in fact one of the dopant materials for forming the P type region of the diode and it forms a good ohmic contact with silicon for good electrical properties. Tin is a good metal to use along with aluminum because, in its use in the combined layer of aluminum and tin, it prevents further penetration of the aluminum into the silicon particularly during the spike cooling stage 64 so that the junction of the diode is not ruined. Thus it is possible to make low voltage alloy junction devices using aluminum and silicon. The aluminum-tin system minimizes cracking during rapid cooling because of the wide range of liquidus-solidus temperature range of this system and it avoids the cracking which might be associated with an aluminum-silicon system having a single point eutectic at 575°C.

When the aluminum, tin and palladium are deposited as described the resulting alloy by weight may have a composition of 80 percent tin, 13 aluminum and 7 percent palladium, varying perhaps to about 90 percent tin, 8½ percent aluminum and 1½ percent palldium.

Platinum and rhodium may be substituted for palladium if desired and when palladium is used on molybdenum slugs it acts as a fluxing agent for removing oxide from the molybdenum.

While the invention has been described particularly in connection with silicon as a semiconductive material it will be understood that this is exemplary only and that the metal system should function equally well with germanium and other semiconductive materials.

As has already been pointed out the thin or flash coating of palladium over the co-deposition of aluminum and tin protects the aluminum from oxidizing while the devices are in storage.

While tin has been described as being deposited by vaporization it will be understood that this also is exemplary and that tin may be chemically or electrolytically deposited in appropriate situations. Correspondingly after aluminum has been deposited palladium can next be deposited and then tin deposited chemically or electrochemically. In this case there would be no co-deposition of aluminum and tin but the final composition in the finished diode the metallic structure would be essentially the same.

What is claimed is:

1. The method of making a semiconductor device including a semiconductor chip, at least one terminal metallurigically bonded to said chip and a glass sleeve sealed to said terminal comprising the steps of:

forming a semiconductor chip having a metallization system thereon comprising a layer of aluminum, a layer of aluminum and tin mixture on said aluminum layer;

providing at least one terminal consisting of one metal selected from the group of molybdenum, copper, nickel, silver, platinum, palladium, rhodium, tungsten, a copper clad steel and an alloy of nickel and cobalt in iron;

disposing said terminal adjacent said semiconductor chip;

providing a glass sleeve surrounding said terminal;

subjecting the assembly of said chip, said terminal and said glass sleeve to a time-temperature cycle comprising an increase in temperature to about 725°–825°C in about 6–10 minutes followed by a decrease in temperature to slightly below the aluminum-silicon eutectic in a period of about 10–30 seconds, and followed by a decrease in temperature to room temperature in about 5–7 minutes.

2. The method according to claim 1 wherein the decrease in temperature to slightly below the aluminum-silicon eutectic is to a temperature of about 500°–550°C.

3. The method according to claim 1 wherein said increase in temperature to about 725°–825°C comprises an increase from ambient to slightly below the aluminum-silicon eutectic in about 5–7 minutes, a hold thereat of about 1–2 minutes, an increase in temperature to about 725°–825°C in about 20–60 seconds, and a hold therat for about 10–60 seconds.

4. The method according to claim 1 wherein the decrease in temperature to slightly below the aluminum-silicon eutectic occurs in a period of about 10–30 seconds.

5. The method according to claim 1 wherein the step of providing at least one terminal comprises selecting the metal molybdenum.

* * * * *